(12) United States Patent
Yamauchi et al.

(10) Patent No.: US 10,510,421 B2
(45) Date of Patent: Dec. 17, 2019

(54) SEMICONDUCTOR STORAGE DEVICE AND READOUT METHOD THEREOF

(71) Applicant: Winbond Electronics Corp., Taichung (TW)

(72) Inventors: Kazuki Yamauchi, Kanagawa (JP); Makoto Senoo, Kanagawa (JP); Hiroki Murakami, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/192,775

(22) Filed: Nov. 15, 2018

(65) Prior Publication Data

US 2019/0156899 A1    May 23, 2019

(30) Foreign Application Priority Data

Nov. 17, 2017   (JP) .................................. 2017-221964

(51) Int. Cl.
| | | |
|---|---|---|
| *G11C 16/06* | (2006.01) | |
| *G11C 16/26* | (2006.01) | |
| *G11C 16/04* | (2006.01) | |
| *G11C 16/34* | (2006.01) | |
| *G11C 16/24* | (2006.01) | |
| *G11C 7/10* | (2006.01) | |

(52) U.S. Cl.
CPC .............. *G11C 16/26* (2013.01); *G11C 7/106* (2013.01); *G11C 16/0408* (2013.01); *G11C 16/24* (2013.01); *G11C 16/3459* (2013.01)

(58) Field of Classification Search
CPC ...... G11C 16/26; G11C 16/24; G11C 16/0408
See application file for complete search history.

(56) References Cited

U.S. PATENT DOCUMENTS

| | | | |
|---|---|---|---|
| 2002/0126531 A1 | 9/2002 | Hosono et al. | |
| 2008/0273386 A1 | 11/2008 | Pyeon | |
| 2014/0347928 A1* | 11/2014 | Lee ..................... | G11C 16/0483 |
| | | | 365/185.11 |
| 2016/0172037 A1* | 6/2016 | Lee ...................... | G11C 15/046 |
| | | | 365/185.12 |

FOREIGN PATENT DOCUMENTS

| | | |
|---|---|---|
| CN | 101740125 | 6/2010 |
| JP | 2001325796 | 11/2001 |
| JP | 2006172523 | 6/2006 |

(Continued)

OTHER PUBLICATIONS

"Office Action of Japan Counterpart Application", dated May 29, 2018, with English translation thereof, p. 1-p. 10.

(Continued)

*Primary Examiner* — Tuan T Nguyen
(74) *Attorney, Agent, or Firm* — JCIPRNET

(57) ABSTRACT

A semiconductor storage device with a smaller chip size than prior art and a readout method are provided. The semiconductor storage device includes a memory cell array; a page buffer/sense circuit having a sensing node for sensing readout data from a selected page of the memory cell array and a latch circuit for holding data sensed by the sensing node; and a controller controls operations on the memory cell array. The sensing node includes an NMOS capacitor.

13 Claims, 4 Drawing Sheets

(56) References Cited

FOREIGN PATENT DOCUMENTS

| JP | 2007193911 | 8/2007 |
| JP | 2017139037 | 8/2017 |
| TW | 201714171 | 4/2017 |
| TW | 201729212 | 8/2017 |
| TW | 201732814 | 9/2017 |

OTHER PUBLICATIONS

"Office Action of Japan Counterpart Application", dated Jul. 31, 2018, with English translation thereof, p. 1-p. 8.
"Office Action of Taiwan Counterpart Application," dated Aug. 13, 2019, pp. 1-12.

* cited by examiner

SEMICONDUCTOR STORAGE DEVICE AND READOUT METHOD THEREOF

CROSS-REFERENCE TO RELATED APPLICATION

This application claims the priority benefit of Japan application serial no. 2017-221964, filed on Nov. 17, 2017. The entirety of the above-mentioned patent application is hereby incorporated by reference herein and made a part of this specification.

BACKGROUND OF THE INVENTION

Field of the Invention

The invention relates to a semiconductor storage device and a readout method, and particularly relates to a page buffer/sense circuit of a flash memory having a sensing node comprising an NMOS capacitor and a readout method for the flash memory.

Description of Related Art

Page buffer of a NAND flash memory holds data readout from a selected page of a memory cell array, or holds data to be programmed to the selected page. The page buffer disclosed in U.S. Patent Publication No. 2008/0273386 includes a first latch to temporarily store data to be programmed and a second latch to hold data readout from the memory cell array.

FIG. 1 illustrates a page buffer/sense circuit of a NAND flash memory connected to a global bit line. The page buffer/sense circuit 10 includes a sense circuit and a latch circuit. The sense circuit senses a bit line potential readout from a selected memory cell, and the latch circuit holds the sensed data or data to be programmed.

The sense circuit includes a transistor BLPRE used for pre-charging the bit line with a voltage provided by a voltage supply portion V1, a transistor BLCLAMP used for clamping the bit line, a sensing node SNS, a transistor BLCD used for transferring charges between the sensing node SNS and a latch node SLR, a transistor DTG used for transferring a voltage of the latch node SLR to a transistor VG, the transistor VG connected to a voltage supply portion V2, and a transistor REG connected between the transistor VG and the sensing node SNS. For example, in verification of a program or an erase operation, voltages of the sensing node SNS and the latch node SLR are correspondingly electrically connected to the voltage supply portion V2, and when the voltage supply portion V2 provides a supply voltage Vcc, the sensing node SNS is charged through the voltage supply portion V2, and when the voltage supply portion V2 provides a ground potential GND, the sensing node SNS is discharged.

The latch circuit includes a pair of cross-coupled inverters, a transistor EQ_EN equalizes the voltages on the latch nodes SLR/SLS, transistors Q1 and Q2 used for connecting the latch nodes SLR/SLS to data lines DL, $\overline{DL}$, a verification transistor Q3 connected to the latch node SLS, and a transistor Q4 enabling the verification. The data lines DL, $\overline{DL}$ are connected to an input-output driver used for converting a single-end signal into a differential signal or converting the differential signal into the single-end signal, and a PCB signal used for controlling switching of a connection between the input-output driver and the data lines DL, $\overline{DL}$ is provided to gates of the transistors Q1 and Q2. Moreover, the transistor Q4 is turned on by an enable signal during the verification.

When charges are transferred from the sensing node SNS to the latch node SLR, the latch nodes SLR and SLS of the latch circuit are equalized to ½ Vcc through the transistor EQ_EN, and data of a logic low (L) level (corresponding to the ground potential) or data of a logic high (H) level (corresponding to the supply voltage Vcc) of the sensing node SNS is transferred to the latch nodes SLR and SLS of the latch circuit. Generally, the sensing node SNS includes a Metal Oxide Semiconductor (MOS) capacitor having an ONO structure (oxide film/nitride film/oxide film) with a large capacitance in a gate insulation film (which is referred to as an ONO capacitor), and in this way, data of the L level and the H level on the sensing node SNS may be compensated.

However, although the ONO capacitor may provide the large capacitance, in view of a layout, its proprietary area becomes larger. The ONO capacitor is, for example, formed by using the same process with the memory cells constituting a NAND string, however, the ONO capacitor is formed in a P-well different to the memory cell. Since a gate structure of the ONO capacitor is different to gate structures of NMOS transistors (for example, the transistor DTG, the transistor VG, the transistor BLCD, the transistor BLPRE, the transistor BLCLAMP, the transistors Q1-Q4, etc.) constructing the page buffer/sense circuit 10, the ONO capacitor and the NMOS transistors constructing the page buffer/sense circuit 10 have to be formed in different P-wells. In the future, if the integration of the memory cell array is continuously advancing, the size of the page buffer/sense circuit 10 would also increase. Namely, since the number of the ONO capacitors of the sensing node SNS has to equal to the number of bits of the page buffer/sense circuit, ONO capacitors play a large influence on the chip size.

SUMMARY OF THE INVENTION

The invention is provided to solve the above problem, and is intended to provide a semiconductor storage device with chip size smaller than prior art. By using a capacitor of an NMOS structure (which is referred to as NMOS capacitor hereinafter) equivalent to NMOS transistors of the page buffer/sense circuit to replace the ONO capacitor of the sensing node, the NMOS capacitor is formed in a P-well in common with the NMOS transistor constructing the page buffer/sense circuit, so as to further reduce the chip size.

The invention provides a semiconductor storage device having a memory cell array, a page buffer/sense circuit and a controller. The page buffer/sense circuit includes: a sensing node including an N-type metal oxide semiconductor (NMOS) capacitor, and sensing data readout from a selected page of the memory cell array; a latch circuit including a latch node coupled to the sensing node, and holding data sensed by the sensing node; and a selective charging circuit including a floating node coupled to the sensing node, and performing selective charging to the sensing node based on a potential of the latch node. The controller is configured to control a readout operation or a program operation on the memory cell array, and control to perform pre-charging to the floating node before performing the selective charging to the sensing node.

The invention provides a readout method for a semiconductor storage device, which includes: a step of receiving data of a selected page of a memory cell array by a sensing node constructed by an NMOS capacitor; and a step of transferring the data of the sensing node to a latch node of a latch circuit through a transfer transistor, where the latch node is connected to the sensing node in a logic low level. In a verification operation, before performing selective charging to the sensing node based on a potential of the latch node, a floating node coupled to the sensing node is pre-charged.

The invention provides a semiconductor storage device including a memory cell array, a page buffer/sense circuit and a controller. The page buffer/sense circuit includes a sensing node including an NMOS capacitor, and sensing data readout from a selected page of the memory cell array; a latch circuit including a latch node coupled to the sensing node, and holding data sensed by the sensing node; a transistor used for charge transfer; and a circuit used for pre-charging a bit line. The controller is configured to control a readout operation or a program operation on the memory cell array. The latch node is coupled to the sensing node through the transistor used for charge transfer, and a path along which the latch node is coupled to the sensing node does not pass through a capacitor with one end coupled to ground, and before the transistor used for charge transfer is turned on to electrically connect the sensing node and the latch node, the controller turns on the transistor used for charge transfer and discharges the latch node through the circuit used for pre-charging, so as to set the latch node to a logic low level.

According to the invention, the sensing node is constructed by the NMOS capacitor, so that compared to the situation that the sensing node is constructed by the ONO capacitor, chip size of the semiconductor storage device is reduced. Further, according to the invention, in the verification operation, by pre-charging the floating node coupled to the sensing node before the sensing node is selected and charged, a potential of the sensing node stabilizes, thus preventing a wrong determination of the verification.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Referring to figures to describe implementations of the invention in detail. An NAND flash memory is taken as a preferred example of the invention. Moreover, it should be noted that various parts are emphasized in the figures to facilitate understanding and are not necessarily drawn to scale.

Figure 2:
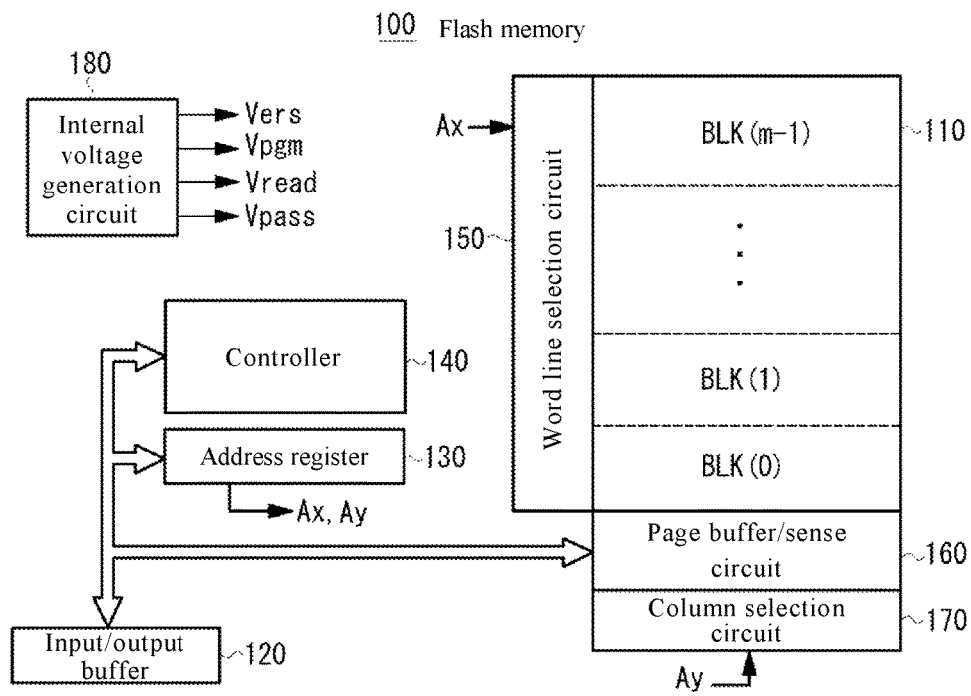
FIG. 2 is a schematic diagram of a flash memory according to an embodiment of the invention.

FIG. 2 illustrates a composition of main parts of a flash memory according to an embodiment of the invention. The composition of the flash memory is only an example, and the invention is not limited thereto. The flash memory 100 of the embodiment includes a memory cell array 110, an input/output buffer 120, an address register 130, a controller 140, a word line selection circuit 150, a page buffer/sense circuit 160, a column selection circuit 170 and an internal voltage generation circuit 180. The memory cell array 110 includes a plurality of memory cells arranged in a matrix. The input/output buffer 120 is connected to an external input/output terminal I/O. The address register 130 receives address information from the input/output buffer 120. The controller 140 receives command data from the input/output buffer 120 to control various parts. The word line selection circuit 150 receives and decodes row address information Ax from the address register 130, and performs block selection, word line section, etc., based on a decoding result. The page buffer/sense circuit 160 holds data readout from a page selected by the word line selection circuit 150, or holds input data to be programmed to the selected page. The column selection circuit 170 receives column address information Ay from the address register 130, and decodes the column address information Ay, and selects data of a corresponding column address in the page buffer/sense circuit 160 based on a decoding result. The internal voltage generation circuit 180 generates various voltages (a program voltage Vpgm, a pass voltage Vpass, a readout pass voltage Vread, and erase voltage Vers, etc.) required for data reading, program and erase operations.

The memory cell array 110 has M memory blocks BLK (0), BLK (1), . . . , BLK (m-1) in a column direction. Each of the memory blocks includes a plurality of NAND string units. One NAND string unit includes a plurality memory cells connected in series, a bit line side selection transistor, and a source line side selection transistor. A drain of the bit line side selection transistor is connected to a corresponding global bit line, and a source of the source line side selection transistor is connected to a common source line.

A control gate of the memory cell is connected to a word line, gates of the bit line side selection transistor and the source line side selection transistor are connected to selection gate lines. The word line selection circuit 150 drives the bit line side selection transistor and the source line side selection transistor via selection gate signals on the selection gate lines based on the row address information Ax, so as to select a block or a word line.

The memory cell may have an MOS structure, and the MOS structure includes: a source/drain formed in a P-well and serving as an N-type diffusion region, a tunnelling oxide film formed on a channel between the source/drain, a floating gate (charge accumulation layer) formed on the tunnelling oxide film, and a control gate formed on the floating gate through a dielectric film. When charges are not accumulated in the floating gate, i.e. written with data "1", a threshold is in a negative state. When charges are accumulated in the floating gate, i.e. written with data "0", the threshold is changed to a positive state. The memory cell may be a Single Level Cell (SLC) adapted to store one bit (binary data), or may be a Multi-Level Cell (MLC) adapted to store multiple bits.

In a readout operation, a positive voltage is applied to the bit line, and 0V is applied to a selected word line, and a pass voltage is applied to non-selected word lines, so that the bit line side selection transistor and the source line side selection transistor are turned on to apply 0V to a common source line. In a program operation, a program voltage Vpgm of a high voltage is applied to the selected word line, and an intermediate potential is applied to the non-selected word lines, such that the bit line side selection transistor is turned on, and the source line side selection transistor is turned off to supply a potential corresponding to data "0" or "1" to the bit line. In an erase operation, 0V is applied to the selected word line in the block, a high voltage is applied to the P-well, and electrons of the floating gate are extracted to a substrate, so as to erase data in a unit of block.

Figure 1:
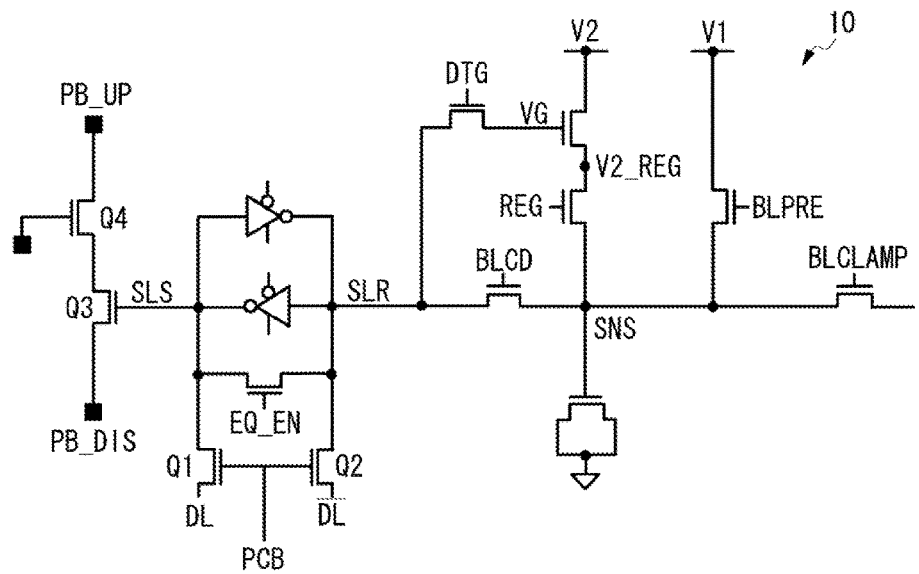
FIG. 1 is a circuit diagram of a page buffer/sense circuit of a conventional flash memory.

A circuit framework of the page buffer/sense circuit 160 of the embodiment is similar to the conventional circuit framework of FIG. 1, a difference between them is that the sensing node SNS of the present embodiment is constructed by an enhancement-type NMOS capacitor other than an ONO capacitor.

The ONO capacitor has high dielectric constant, so that regardless of whether the sensing node SNS adopting the ONO capacitor is in H level or L level, it may fully function as a capacitor. Namely, before the charges of the sensing node SNS are transferred to the latch node SLR, the latch nodes SLR and SLS are equalized to ½ Vcc, and then the transistor BLCD is turned on, and the charges of the sensing node SNS are transferred to the latch node SLR. If the sensing node SNS is in the H level, the latch node SLR is charged to a potential sufficiently higher than an inverted threshold, and if the sensing node SNS is in the L level, the latch node SLR is discharged to a potential sufficiently lower than the inverted threshold.

Figure 3:
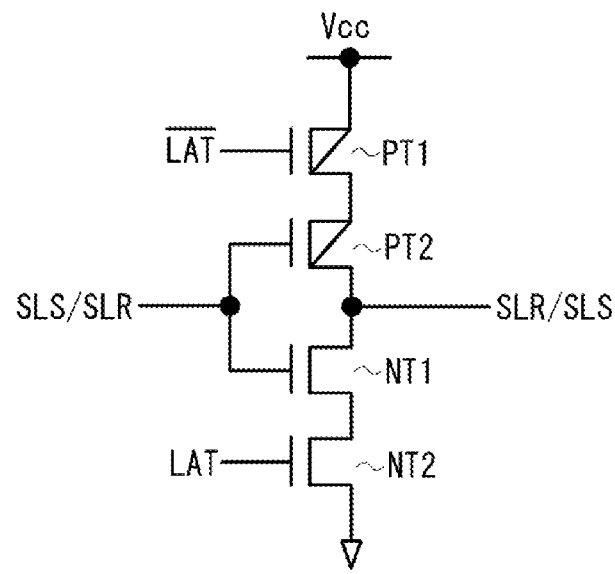
FIG. 3 is a circuit diagram of an inverter of a latch circuit.

FIG. 3 is a circuit diagram of an inverter of the latch circuit. The inverter includes 4 transistors connected in series, i.e. P-type transistors PT1 and PT2 and N-type transistors NT1 and NT2. Latch enable signals $\overline{LAT}$, LAT are respectively input to gates of the transistors PT1 and NT2, and when the latch enable signal LAT is in the H level, the inverter may operate, and when the latch enable signal LAT is in the L level, the transistors PT2 and NT1 become a tristate state disconnected from Vcc and the ground, so that the input of the inverter may be changed.

Figure 4:
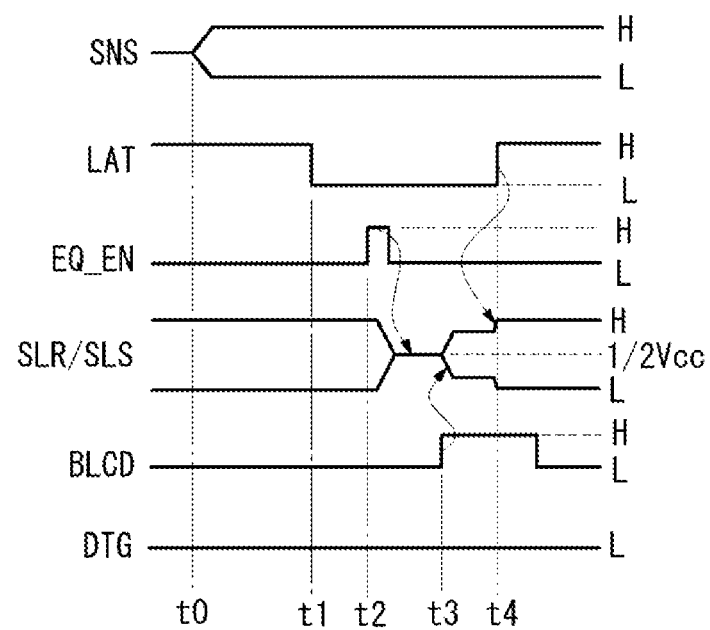
FIG. 4 is a timing diagram of charge transfer when a sensing node adopts an ONO capacitor.

FIG. 4 is a timing diagram of charge transfer when the ONO capacitor is adopted. At a time point t0, data of the selected memory cell is read out, and the potential of the sensing node SNS becomes the H level or the L level corresponding to the data stored in the selected memory cell. At a time point t1, the latch enable signal LAT becomes the L level, and the latch circuit becomes the tristate state. At a time point t2, a gate signal of the transistor EQ_EN becomes the H level, accordingly, the latch nodes SLR and SLS are equivalent to ½ Vcc. At a time point t3, the transistor BLCD is turned on, the charges of the sensing node SNS are transferred to the latch node SLR, and the potential of the latch node SLR and the level of the sensing node SNS are correspondingly migrated. At a time point t4, if the latch enable signal LAT becomes the H level, the latch circuit may operate to set the potential of the latch nodes SLR and SLS to the H level (Vcc) or the L level (grounded). During such period, the transistor DTG is turned off in order to reduce a load capacitance of wiring.

Comparatively, in the embodiment, the sensing node SNS adopts the NMOS capacitor. However, if a gate voltage does not exceed a threshold, no inversion layer is formed in the channel region, and the sensing node SNS cannot function sufficiently as a capacitor. Namely, if the sensing node SNS is in the H level, the NMOS capacitor may fully function, but if the sensing node SNS is in the L level, the NMOS capacitor cannot function.

Therefore, in the embodiment, when the latch circuit is initialized during the readout operation, the voltages on the latch nodes SLR and SLS are not equalized, and the latch node SLR is set to be in the L level. In other words, before the charges of the sensing node SNS are transferred to the latch node SLR (when the transistor BLCD is turned off), the latch node SLR is set to be in the L level or the ground level (data "0"). In this way, when the charges are transferred, if the sensing node SNS is in the H level, the potential of the latch node SLR is migrated from the L level to the H level, and if the sensing node SNS is in the L level, the potential of the latch node SLR is maintained at the L level. The NMOS capacitor transfers the charges only in case of being in the H level, and the NMOS capacitor is adjusted to have a capacitance that allows the potential of the latch node SLR to be substantially migrated to the H level.

Figure 5:
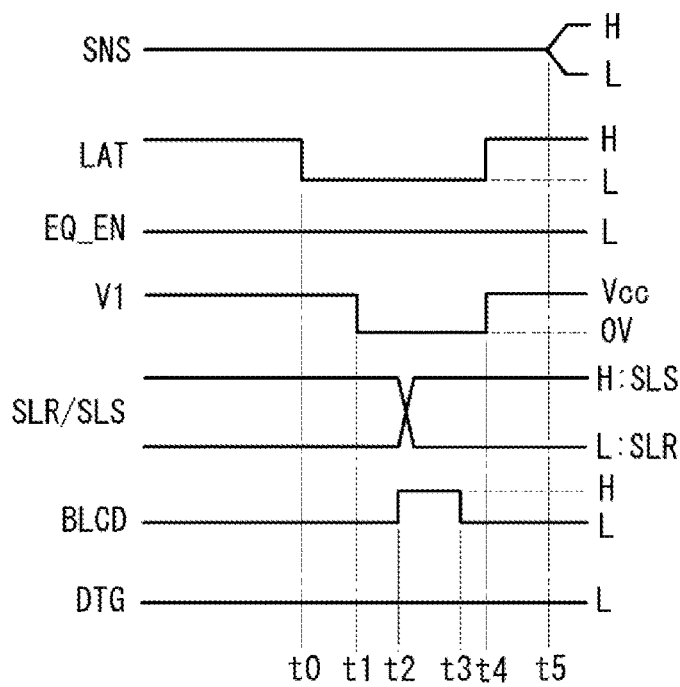
FIG. 5 is a timing diagram of charge transfer when the sensing node adopts an NMOS capacitor of an embodiment of the invention.

FIG. 5 is a timing diagram of charge transfer when the NMOS capacitor of the embodiment is adopted. The controller 140 controls the gate signals applied to the transistors used for controlling the operation of the page buffer/sense circuit 160. At a time point t0, the latch enable signal LAT becomes the L level, the latch circuit becomes the tristate state. At a time point t1, the controller 140 changes a voltage of the voltage supply portion V1 from Vcc to 0V (the ground level). At a time point t2, the transistor BLCD is turned on. In this way, the charges of the latch node SLR of the latch circuit are discharged to the voltage supply portion V1 through the transistor BLCD, and the latch node SLR is set to be in the L level. At a time point t3, the transistor BLCD is turned off. At a time point t4, the latch enable signal LAT becomes the H level, and the voltage supply portion V1 supplies the Vcc level. In this way, the latch node SLR is set to be in the L level. Then, at a time point t5, data of the selected memory cell is read out. The charges corresponding to the data of the selected memory cell are held at the sensing node SNS, and the held charges are transferred to the latch node SLR on standby at the L level through the transistor BLCD.

In this way, by using the NMOS capacitor to replace the ONO capacitor to construct the sensing node SNS of the page buffer/sense circuit 160, the sensing node SNS may be formed in a same well as the NMOS transistors constructing the page buffer/sense circuit 160, so as to reduce chip size.

Thereafter, a second embodiment that the sensing node SNS is constructed by the NMOS capacitor is described below. In verification after the program operation or the erase operation, when the verification is passed (success, i.e. the data is correctly programmed or erased), the latch node SLR becomes the H level, the latch node SLS becomes the L level, the transistor Q3 is turned off, and charges of a node PB_UP are not discharged to a node PB_DIS (grounded). On the other hand, when the verification is not passed (failed), the latch node SLR becomes the L level, the latch node SLS becomes the H level, the transistor Q3 is turned on, and the charges of the node PB_UP are discharged to the node PB_DIS.

In the program operation, input data loaded to the latch circuit is set to the sensing node SNS, and if the input data is "0", the latch node SLR and the sensing node SNS are set in the L level (0V), and the data "0" is programmed to the selected memory cell. If the input data is "1", the latch node SLR and the sensing node SNS are set in the H level (Vcc), and the selected memory cell is not programmed, i.e. maintained to data "1".

Regarding the program operation, incremental step program pulse (ISPP) can be adopted to provide a program pulse, and program verification is performed after each program pulse. In the program verification, if data "0" is correctly programmed to the selected memory cell, the selected memory cell is disconnected through a readout operation of the verification, the sensing node SNS is in the H level, and the charges on the sensing node SNS are transferred to the latch node SLR through the transistor BLCD, such that the latch node SLR on standby at the L level is flipped to the H level, and the latch node SLS is flipped to the L level. In the verification, the transistor Q4 is turned on by an enable signal, and the transistor Q3 is turned off, so as to output a passing (success) result. When a next program pulse is applied, the latch node SLR corresponding to the memory cell passing the verification is set to the H level to prohibit being programmed.

On the other hand, if the data "0" is not programmed to the selected memory cell, the selected memory cell is conducted through the readout operation of the verification, and the sensing node SNS is in the L level. Since the latch node SLR is on standby at the L level, even if the transistor BLCD is turned on, the latch node SLR is still maintained at the L level. Therefore, the voltage of the latch node SLS becomes the H level, and the transistor Q3 is turned on, so as to output a fail (not passing) result. When the next program pulse is applied, the latch node SLR corresponding to the memory cell not passing the verification is set to the L level to allow being programmed.

Figure 6:
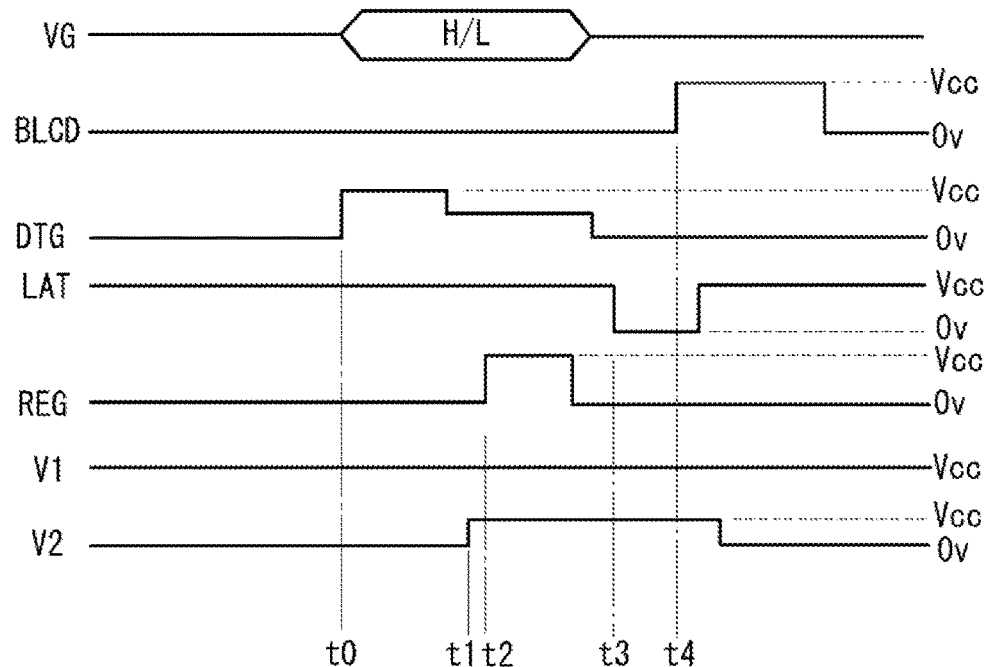
FIG. 6 is a timing diagram of charging sensing node to an H level according to an embodiment of the invention.

In the program verification, the sensing node SNS of the memory cell passing the verification is selectively charged by a voltage coming from the voltage supply portion V2. FIG. 6 is a timing diagram when the sensing node SNS is selectively charged to the H level. At a time point t0, the transistor DTG is turned on to supply the H level of the latch node SLR to the gate of the transistor VG. At a time point t1, the voltage of the voltage supply portion V2 is changed from 0V to Vcc, accordingly, the gate of the transistor VG is self-boosted, and the transistor VG is strongly turned on. At a time point t2, the transistor REG is turned on, and the sensing node SNS is charged to the H level through the voltage Vcc supplied by the voltage supply portion V2. In case that the latch node SLR is in the L level, the transistor VG is turned off, and the sensing node SNS is not charged through the voltage supply portion V2. At a time point t3, the latch enable signal LAT is the L level, and the latch circuit becomes the tristate state. At a time point t4, the transistor BLCD is turned on to transfer the charges of the sensing node SNS charged to the H level to the latch node SLR.

However, when the sensing node SNS is selectively charged, a potential of the sensing node SNS in the H level is probably varied due to an influence of noise. According to whether the transistor VG is turned on or turned off during the previous selective charging, a node V2_REG (referring to FIG. 1) has an uncertain potential (floating) in the H level or the L level. It is assumed that the node V2_REF is in a floating state of the L level, when the charges of the H level of the sensing node SNS of the memory cell passing the program verification are transferred to the latch node SLR through the transistor BLCD, a part of the charges of the sensing node SNS is consumed in order to charge the node V2_REG, resulting the inability to charge the latch node SLR above a threshold for flipping the latch circuit to the H level. Namely, a boundary between the H level of the sensing node SNS and the threshold for flipping the latch node SLR to the H level becomes smaller, so that the latch node SLR is probably not flipped to the H level thus resulting in a wrong verification result.

In the second embodiment, during the readout period of the program verification before performing selective charging to the sensing node SNS, pre-charging is performed to the node V2_REG, so that the node V2_REG is fixed to the floating state of the H level. In this way, when the charges of the H level of the sensing node SNS of the memory cell passing the program verification are transferred to the latch node SLR, consumption of the charges of the sensing node SNS by the node V2_REG is prevented, so as to sufficiently ensure the boundary between the H level of the sensing node SNS and the threshold for flipping the latch node SLR to the H level, and compensate the latch node SLR migrated from the L level to the H level.

Figure 7:
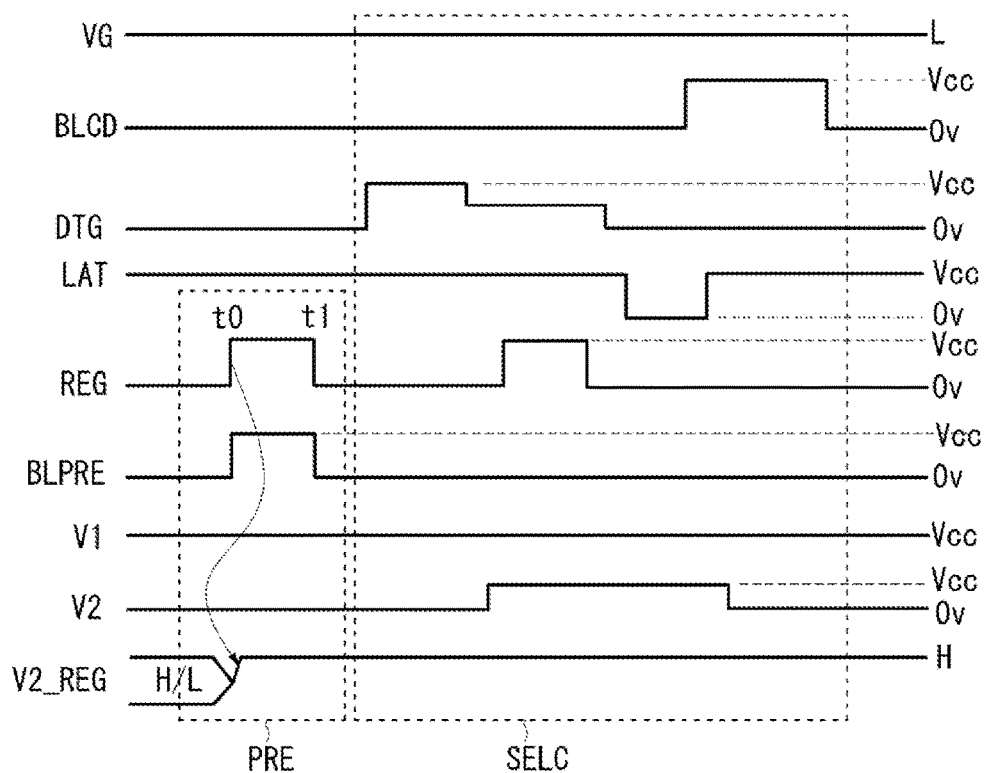
FIG. 7 is a timing diagram of pre-charging a flash memory according to an embodiment of the invention.

FIG. 7 is a timing diagram of pre-charging the node V2_REG according to the second embodiment of the invention. In the embodiment, the input data "0" is loaded to the latch circuit, the charges of the H level of the sensing node SNS of the memory cell passing the program verification are transferred to the latch node SLR, and the L level is applied to the gate of the transistor VG. Moreover, the voltage supply portion V1 supplies the voltage Vcc. During the period of time point t0-t1, the transistor REG is turned on, and meanwhile the transistor BLPRE is turned on. In this way, the voltage Vcc supplied by the voltage supply portion V1 pre-charges the node V2_REG to the H level through the sensing node SNS. A range PRE represents a pre-charging period of the node V2_REG, and a range SELC represents a period of selective charging. The pre-charging of the node V2_REG is implemented by using a readout period (a period of applying a verification readout voltage to a word line of the selected memory cell) of the selected memory cell in the program verification, i.e. before the charges of the global bit line are read out by the sensing node SNS. Then, the charges on the global bit line are read out by the sensing node SNS through the transistor BLCLAMP, and then the charges of the sensing node SNS are transferred to the latch node SLR through the transistor BLCD. Moreover, the selective charging of the sensing node SNS is carried out according to the timing diagram of FIG. 6. Now, the node V2_REG is pre-charged to the H level, accordingly, even the transistor REG is turned on, the charges of the sensing node SNS can be transferred to the latch node SLR without being consumed by the node V2_REG.

In this way, according to the embodiment, before performing the selective charging to the sensing node SNS, the node V2_REG is pre-charged, so that when the selective charging is performed to the sensing node SNS, consumption of the charges of the H level of the sensing node SNS by the node V2_REG is prevented, and sufficient charges may be transferred to the latch node SLR to flip the latch node SLR on standby at the L level to the H level. Therefore, a wrong determination of the program verification may be prevented.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor storage device, comprising:
   a memory cell array;
   a page buffer/sense circuit, comprising:
      a sensing node, comprising an N-type metal oxide semiconductor (NMOS) capacitor, and sensing data readout from a selected page of the memory cell array;
      a latch circuit, comprising a latch node coupled to the sensing node, and holding data sensed by the sensing node; and a selective charging circuit, comprising a floating node coupled to the sensing node, and performing selective charging to the sensing node based on a potential of the latch node; and a controller, configured to control a readout operation or a program operation on the memory cell array, and control to perform pre-charging to the floating node before performing the selective charging to the sensing node.

2. The semiconductor storage device as claimed in claim 1, wherein the controller is configured to set the latch node to a logic low level in the readout operation.

3. The semiconductor storage device as claimed in claim 2, wherein the page buffer/sense circuit comprises a transfer transistor used for charge transfer between the sensing node and the latch node, and the controller sets the latch node to the logic low level before the transfer transistor is turned on.

4. The semiconductor storage device as claimed in claim 2, wherein the NMOS capacitor is formed in a same P-well with an NMOS transistor of the page buffer/sense circuit.

5. The semiconductor storage device as claimed in claim 3, wherein the NMOS capacitor is formed in a same P-well with an NMOS transistor of the page buffer/sense circuit.

6. The semiconductor storage device as claimed in claim 1, wherein the NMOS capacitor is formed in a same P-well with an NMOS transistor of the page buffer/sense circuit.

7. The semiconductor storage device as claimed in claim 1, wherein the selective charging circuit comprises a voltage supply portion, a first transistor and a second transistor connected in series between the voltage supply portion and the sensing node, and a third transistor connected between the first transistor and the latch node, wherein the floating node is disposed between the first transistor and the second transistor, and the floating node is pre-charged when the second transistor is turned on.

8. The semiconductor storage device as claimed in claim 7, wherein the floating node is pre-charged by a voltage coming from the voltage supply portion when a global bit line is pre-charged.

9. The semiconductor storage device as claimed in claim 8, wherein the floating node is pre-charged during a period of applying a verification readout voltage to a selected word line.

10. The semiconductor storage device as claimed in claim 7, wherein the floating node is pre-charged during a period of applying a verification readout voltage to a selected word line.

11. A readout method for a semiconductor storage device, comprising:

a step of receiving data of a selected page of a memory cell array by a sensing node constructed by an N-type metal oxide semiconductor capacitor; and a step of transferring the data of the sensing node to a latch node of a latch circuit through a transfer transistor, wherein the latch node is configured to a logic low level, wherein in a verification operation, before performing selective charging to the sensing node based on a potential of the latch node, a floating node coupled to the sensing node is pre-charged.

12. The readout method for the semiconductor storage device as claimed in claim 11, wherein in a program verification operation, the floating node is pre-charged during a period of applying a verification readout voltage to a selected memory cell.

13. A semiconductor storage device, comprising:

a memory cell array;

a page buffer/sense circuit, comprising:

a sensing node, comprising an N-type metal oxide semiconductor capacitor, and sensing data readout from a selected page of the memory cell array;

a latch circuit, comprising a latch node coupled to the sensing node, and holding data sensed by the sensing node;

a transistor used for charge transfer; and a circuit used for pre-charging a bit line; and a controller, configured to control a readout operation or a program operation on the memory cell array, wherein the latch node is coupled to the sensing node through the transistor used for charge transfer, and a path along which the latch node is coupled to the sensing node does not pass through a capacitor with one end coupled to ground, and before the transistor used for charge transfer is turned on to electrically connect the sensing node and the latch node, the controller turns on the transistor used for charge transfer and discharges the latch node through the circuit used for pre-charging, so as to set the latch node to a logic low level.

* * * * *